(12) United States Patent
Huang et al.

(10) Patent No.: US 10,468,340 B2
(45) Date of Patent: Nov. 5, 2019

(54) WIRING STRUCTURE AND SEMICONDUCTOR PACKAGE HAVING THE SAME

(71) Applicant: Advanced Semiconductor Engineering, Inc., Kaohsiung (TW)

(72) Inventors: Wen Hung Huang, Kaohsiung (TW); Yan Wen Chung, Kaohsiung (TW); Wei Chu Sun, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 27 days.

(21) Appl. No.: 15/625,920

(22) Filed: Jun. 16, 2017

(65) Prior Publication Data
US 2018/0366402 A1    Dec. 20, 2018

(51) Int. Cl.
*H01L 23/498* (2006.01)
*H01L 23/00* (2006.01)

(52) U.S. Cl.
CPC ...... *H01L 23/49838* (2013.01); *H01L 23/498* (2013.01); *H01L 23/49811* (2013.01); *H01L 24/16* (2013.01); *H01L 2224/16225* (2013.01); *H01L 2224/16238* (2013.01); *H01L 2224/2919* (2013.01); *H01L 2224/32225* (2013.01); *H01L 2224/73204* (2013.01)

(58) Field of Classification Search
CPC .................................................. H01L 23/49838
See application file for complete search history.

(56) References Cited

U.S. PATENT DOCUMENTS

| | | | |
|---|---|---|---|
| 2005/0158553 A1* | 7/2005 | Hirose | H05K 1/0256 428/411.1 |
| 2011/0042828 A1* | 2/2011 | Sota | H01L 23/13 257/774 |
| 2017/0178983 A1* | 6/2017 | Liu | H01L 22/32 |

* cited by examiner

*Primary Examiner* — Peniel M Gumedzoe
*Assistant Examiner* — Christopher A Johnson
(74) *Attorney, Agent, or Firm* — Foley & Lardner LLP; Cliff Z. Liu

(57) ABSTRACT

The present disclosure relates to a wiring structure and a semiconductor package. The wiring structure comprises a first wiring pattern, a dielectric layer and a dummy structure. The first wiring pattern includes a conductive land having a width W1 and a surface area A, and a conductive trace having a width W2 and electrically connected to the conductive land, wherein ((W1*W2)/A)*100%≤ about 25%. The dielectric layer covers the first wiring pattern, and the dummy structure is adjacent to the conductive trace.

23 Claims, 8 Drawing Sheets

WIRING STRUCTURE AND SEMICONDUCTOR PACKAGE HAVING THE SAME

BACKGROUND

1. Technical Field

The present disclosure relates to a wiring structure, a semiconductor package including a wiring structure, a method of making the wiring structure and a method of making the semiconductor package. The present disclosure relates to a wiring structure including a dummy structure that can provide for improving a plating uniformity of the wiring structure.

2. Description of the Related Art

It can be desirable to miniaturize semiconductor devices, in some implementations. Miniaturization of semiconductor devices can provide for improved device performance and reduced device manufacturing cost. Fine line design in wiring structures of semiconductor devices are an example of such miniaturization. A wiring structure of a fine line design can include conductive traces and conductive lands. A width of a conductive land can, in some implementations, range from about 15 micrometers (μm) to about 200 μm, which can be greater than a width of a conductive trace in a range from about 2 μm to about 10 μm. After plating of the wiring structure is completed, a dielectric layer or a passivation layer can be formed on the wiring structure to cover the conductive traces and conductive lands. An opening can subsequently be formed in the dielectric layer or the passivation layer to expose the conductive lands.

The fine line wiring design can be complicated and challenging. In particular, plating uniformity can be an issue of concern for a wiring structure during a manufacturing process. In some implementations, the plating uniformity is controlled to within 10% (e.g. an amount of plating for each of two or more areas on which plating is implemented differs between respective areas by no more than 10% of the average thickness of the plating of the two or more areas). If a width of a conductive land is much greater than a width of a conductive trace, during a plating process, a rate of deposition of metal ions of a plating solution on conductive lands will be higher than a rate of deposition of metal ions on conductive traces. As a result, a thickness of a conductive land can be greater than a thickness of a conductive trace, which may form a thickness gap (a difference in thickness). The thickness gap can have at least two significant impacts on a wiring structure. One is that stress may be focused on a corner or junction of conductive lands and conductive traces, so that the wiring structure is subject to a risk of cracking of the conductive traces. A second potential impact is, if a thickness of the wiring structure is thin, for example, a thickness of conductive traces is about 2 μm for at least some industrial implementations, during plating, a thickness of conductive lands can grow to about 4 μm or more, and, if a dielectric layer or a passivation layer with an approximately 4 μm thickness is provided, the dielectric layer or passivation layer may not fully cover the conductive lands, which can lead to electrical problems of the wiring structure, such as leakage.

Furthermore, if a relatively thicker dielectric layer, passivation layer or a stacked multi-layer passivation is used to cover the wiring structure, a thickness of the dielectric layer or passivation layer disposed on the conductive land is increased. Thus, the entire wiring structure can become thicker and may not meet some thickness specifications (e.g. some industrial standard specifications) of the wiring structure. The whole wiring design may need to be modified and changed.

SUMMARY

One advantage provided for in the present disclosure is to reduce a difference in thickness of conductive lands and conductive traces of a wiring structure after plating. In accordance with some embodiments of the present disclosure, a wiring structure includes a first wiring pattern, a dielectric layer and a dummy structure. The first wiring pattern includes a conductive land having a width W1 and a surface area A, and a conductive trace having a width W2 and electrically connected to the conductive land, wherein $((W1*W2)/A)*100\% \leq$ about 25%. The dielectric layer covers the first wiring pattern, and the dummy structure is adjacent to the conductive trace.

In accordance with some embodiments of the present disclosure, a semiconductor package includes the above-mentioned wiring structure. The semiconductor package can include a semiconductor chip electrically connected to the wiring structure, and an encapsulant covering the semiconductor chip.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
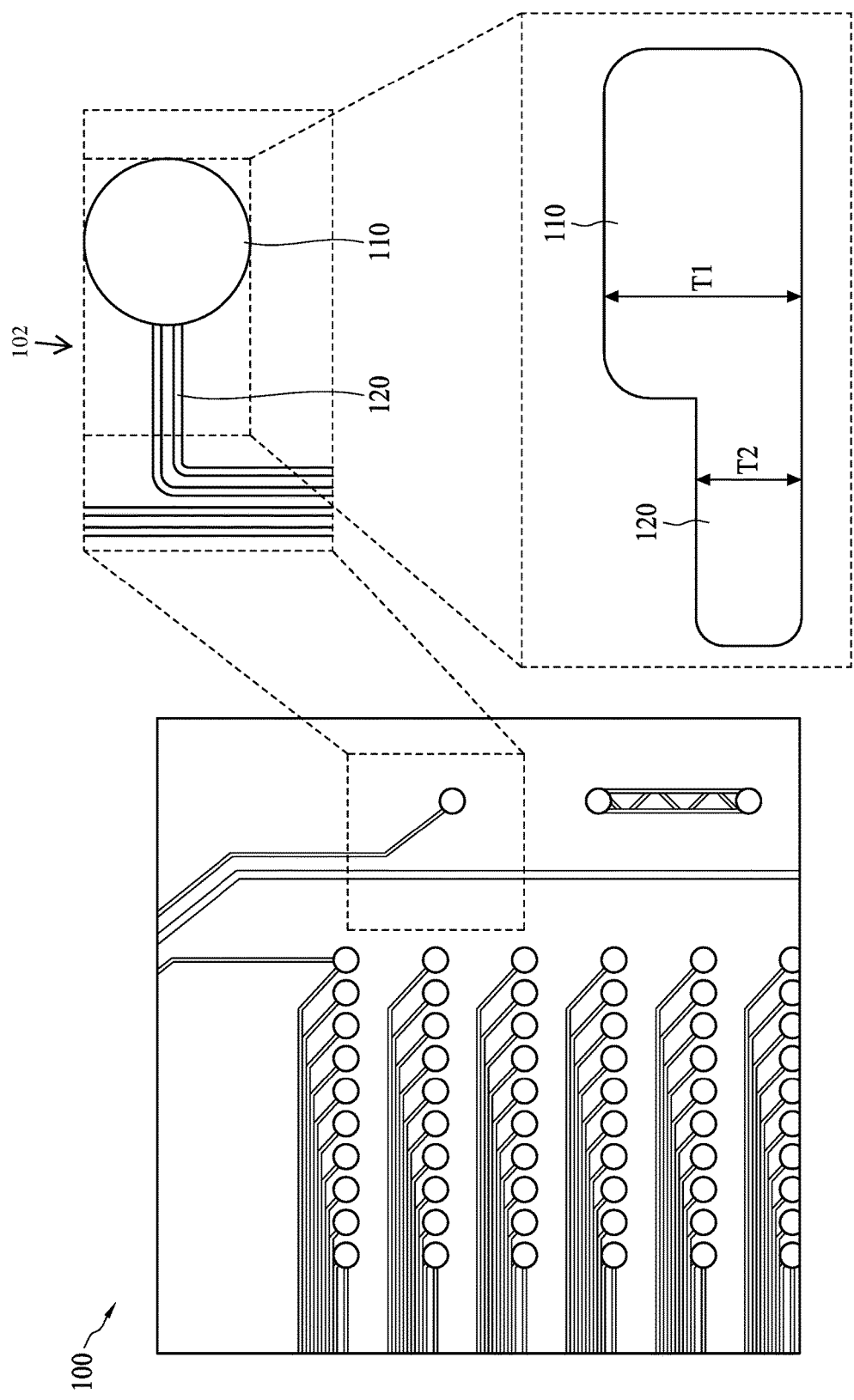
FIG. 1 shows a top view of a wiring structure in accordance with some comparative designs of a wiring structure.

FIG. 1 shows a top view of a wiring structure 100 in accordance with some comparative designs of a wiring structure. As shown in FIG. 1, the wiring structure 100 includes a first wiring pattern 102. Shown at the upper right side of FIG. 1 is a magnified view of a portion of the wiring structure 100. The first wiring pattern 102 includes one or more conductive lands 110 and one or more conductive traces 120. Shown at the lower right side of FIG. 1 is a cross-sectional view of the magnified portion of the wiring structure 100. A thickness of one of the conductive lands 110 is T1 and a thickness of the conductive traces 120 is T2. The plating uniformity U can be calculated, for example, by the formula: U=(T1 (the thickness of the conductive land)−T2 (the thickness of the conductive traces))/(2*(average of T1 and T2))*100%. For example, if after plating, T1 is about 4 μm and T2 is about 2 μm, the plating uniformity U is about: U=(4 μm−2 μm)/(2*((4 μm+2 μm)/2))*100%=33.3%. This can indicate that there is a thickness gap between the conductive lands 110 and the conductive traces 120, and the plating uniformity may not meet design specifications. Consequently, a corner or junction of the conductive lands 110 and the conductive traces 120 may be subject to significant stresses, which can lead to cracking of the conductive traces.

Figure 2:
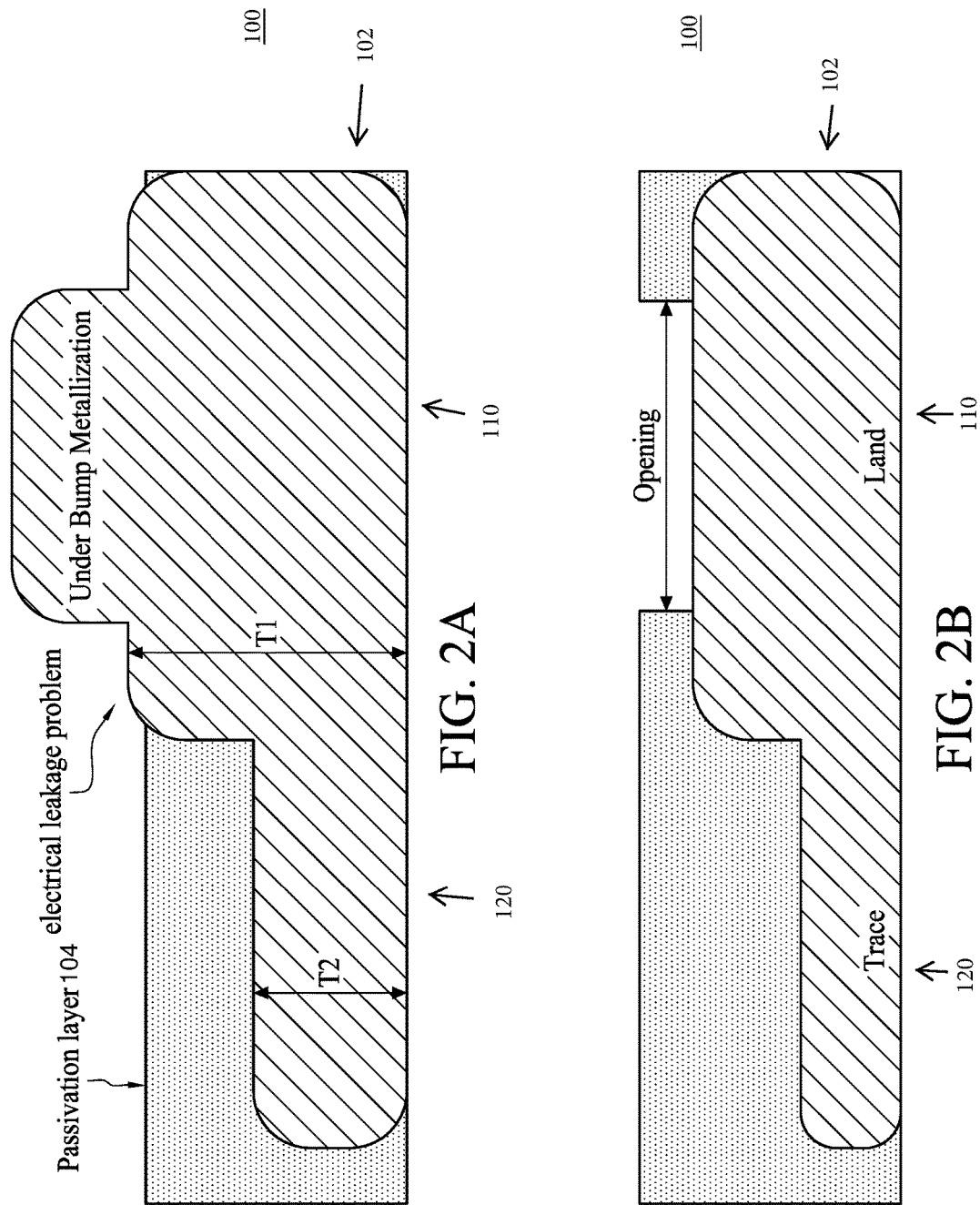
FIG. 2A and FIG. 2B each shows a cross-sectional view of the wiring structure shown in FIG. 1.

Other problems caused by the thickness gap are described below in reference to FIG. 2A and FIG. 2B. FIG. 2A show a cross-sectional view of the wiring structure 100 shown in FIG. 1. In FIG. 2A, passivation layer 104 (or a dielectric layer or stacked multi-layer passivation structure) covers the first wiring pattern, and an under bump metallization is disposed on a portion of the conductive land 110 that is exposed form the passivation layer 104. Design specifications may specify that the thickness of the passivation layer 104 is about 4 μm. As shown in FIG. 2A, the thickness T1 of the conductive land 110 in the depicted example is also about 4 μm, and the passivation layer 104 does not fully cover the first wiring pattern, which may cause electrical leakage from the wiring structure 100 (e.g. a portion of the conductive land 110 is undesirably exposed from the passivation layer 104, which can lead to, for example, unintended shorts or other electrical leakage problems).

FIG. 2B shows a cross-sectional view of the wiring structure 100 shown in FIG. 1. As shown in FIG. 2B, a relatively thicker passivation layer 104 (or dielectric layer or stacked multi-layer passivation structure) than is shown in FIG. 2A is implemented to cover at least a portion of the first wiring pattern. The passivation layer 104 can define an opening over one of the conductive lands 110 and thereby expose at least a portion of the conductive land 110. As a result, the wiring structure 100 as a whole can be thicker (e.g. can be increased by about 20 μm or less, such as, for example, by about 18 μm or less, by about 16 μm or less, by about 14 μm or less, by about 12 μm or less, or by about 10 μm or less), and can thus fail to meet some design specifications. The design of the wiring structure 100 may need to be modified and changed.

Figure 3:
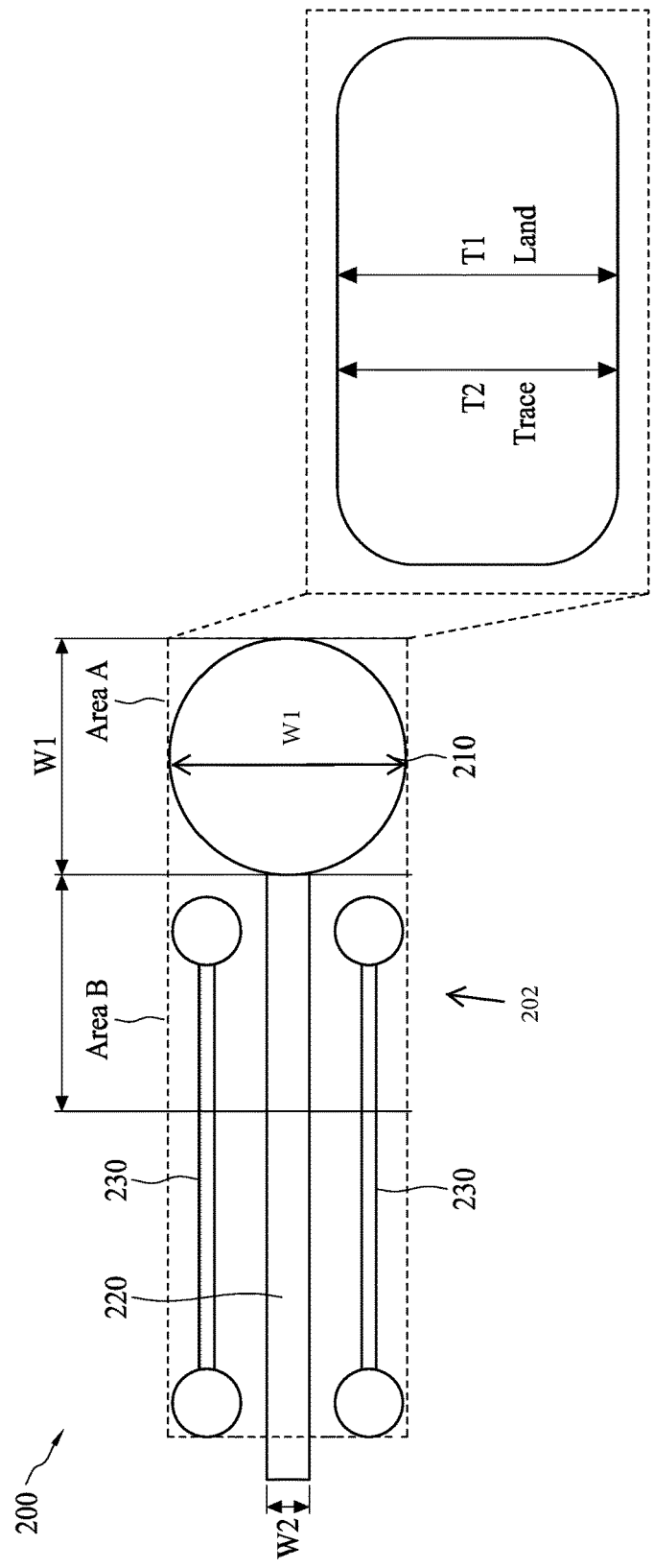
FIG. 3A illustrates a top view of some embodiments of a wiring structure in accordance with a first aspect of the present disclosure.
FIG. 3B illustrates some embodiments of a cross-sectional view of the wiring structure shown in FIG. 3A in accordance with the first aspect of the present disclosure.

The present disclosure provides for a wiring structure including a dummy pattern (which can include one or more dummy structures) that can have improved plating uniformity. FIG. 3A illustrates a top view of some embodiments of a wiring structure 200 in accordance with a first aspect of the present disclosure. As shown in FIG. 3A, the wiring structure 200 includes a first wiring pattern 202 including a conductive land 210 and a conductive trace 220. The conductive land 210 has a width W1 and is substantially circular (in other embodiments, the conductive land 210 can be any other appropriate shape, including a shape that is not circular). An imaginary reference area A is depicted in FIG. 3A, which is substantially square shaped and includes four lines that are each tangential to the substantially circular conductive land 210. The conductive trace 220 is substantially rectangular in shape (in other embodiments, the conductive trace 220 can be any other appropriate shape, including a shape that is not rectangular), and has a width W2 that is shorter than is a length of the conductive trace 220. The conductive trace 220 is electrically connected to the conductive land 210. The conductive trace 220 can be part of a redistribution layer (RDL).

Table 1 shows example data of some relations between a ratio of the width W2 of the conductive trace 220 to the width W1 of the conductive land 210, an area ratio, and a resultant difference in thickness in percentage form. It is assumed that the width of the conductive land 210 is about 40 μm. Thus, an area of the conductive land (e.g. a surface area) is $\pi*20^2$ μm$^2$=about 1,256 μm$^2$. A portion of the conductive trace 220 that is referred to in the following discussion is a portion of the conductive trace 220 that lies within an imaginary reference area B having substantially the same dimensions as imaginary area A. Thus, in the below description, a reference to an area of the conductive trace 220 is a reference to that portion of the conductive trace 220 which falls within area B, and is substantially equal to the width W2 times W1 (the length of the portion of interest). As shown in Table 1, for example, when the width of the conductive trace 220 is about 2 μm, a ratio of the width of the conductive trace 220 to the width of the conductive land 210 is 0.05, the area ratio of the area of the conductive trace 220 to the area of the conductive land 210 is about 6.4%, and the resultant difference in thickness between the conductive trace and the conductive land is greater than about 60%. According to this experimental data, if ((W1*W2)/(area of the conductive land))*100% ≤ about 25% (e.g. the area ratio of the conductive trace and the conductive land), a difference in thickness between the conductive land and the conductive trace during or after plating will be greater than about 10%, which in some cases is more than about 1 μm.

TABLE 1

| Conductive Trace (Width W2) | Conductive Land (Width W1) | Ratio | Area Ratio | Difference (Thickness) |
|---|---|---|---|---|
| 2 μm | 40 μm | 0.05 | 6.4% | >60% |
| 3 μm | 40 μm | 0.75 | 9.6% | 40% |
| 4 μm | 40 μm | 0.1 | 12.7% | 25% |
| 5 μm | 40 μm | 0.125 | 15.9% | 20% |
| 6 μm | 40 μm | 0.15 | 19.1% | 15% |
| 7 μm | 40 μm | 0.175 | 22.3% | 11% |
| 8 μm | 40 μm | 0.2 | 25.5% | 9% |

In some embodiments, a first reference zone can be specified by a smallest rectangular shape that can encompass a conductive land (e.g. that can encompass a cross section of the conductive land that has a largest cross-sectional area of any cross section of the conductive land). A second reference zone can have the same dimensions as the first reference zone and can be disposed adjacent to the first reference zone. At least a portion of a conductive trace can be disposed in the second reference zone. An area of the conductive trace can be specified as an area of the conductive trace that falls within the second reference zone. In some embodiments, a ratio of the area of the conductive trace to an area of the conductive land is greater than or equal to about 25%, such as about 27% or more, about 29% or more, about 31% or more, about 33% or more, or about 35% or more. This can provide for uniform plating, such as plating uniformity that is controlled to within about 10% or less (e.g. about 9% or less, about 8% or less, about 7% or less, about 6% or less, or about 5% or less), which can satisfy some industrial standards.

In some embodiments a material for the conductive traces and the conductive lands includes a conductive material, such as metal, and the area ratio can be specified as a ratio of an amount of metal contained in the conductive trace 220 to an amount of metal contained in the conductive land 210 (e.g. as measured by volume or by mass). As shown in Table 1, when the width of the conductive trace is about 8 μm and the width of the conductive land is about 40 μm, the area ratio is about 25.2% and the difference in thickness is about 9%. This tends to show that when the area ratio is greater than or equal to about 25%, the plating uniformity is controlled to within about 10%, which is improved plating uniformity relative to some comparative examples.

Thus, the present disclosure sets the area ratio of about 25% as one possible threshold value for some embodiments. As shown in FIG. 3A, where the area ratio of the area of the conductive trace 220 to the area of the conductive land 210 is less than or equal to about 25%, one or more dummy structures 230 (e.g. non-functional structures, such as structures that do not serve as part of a functional current path (e.g. does not electrically connect to a die), but which may serve other functions, such as providing structural support or spacing) can be added to the first wiring pattern 202, so as to make a total area ratio of structures in area B (e.g. the conductive trace 220, any dummy structures 230, and any other relevant structures (should there be any)) to the area of the conductive land 210 is greater than about 25%, such as about 27% or more, about 29% or more, about 31% or more, about 33% or more, or about 35% or more. One or more of the dummy structures 230 can be arranged adjacent to the conductive trace 220 and isolated from (e.g. spaced apart from and/or electrically isolated from) the conductive land 210 and the conductive trace 220. According to the above wiring structure, the one or more dummy structures 230 can be configured such that a total area ratio of the conductive trace 220 and the dummy structures 230 to the area of the conductive land 210 is greater than about 25%, such as about 27% or more, about 29% or more, about 31% or more, about 33% or more, or about 35% or more. This can provide for plating uniformity (e.g. controlled to within 10% or less), promoting evenness of the wiring structure 200 after a plating process and helping to meet some specifications of plating uniformity (e.g. helping to meet some industrial standards). Additionally, stress between the conductive land 210 and the conductive trace 220 can be reduced due to the evenness of the wiring structure 200.

A distance d between the dummy structure 230 and the conductive trace 220 can be, for example, equal to or greater than about 2 μm such as about 2.2 μm or greater, about 2.4 μm or greater, about 2.6 μm or greater, about 2.8 μm or greater, or about 3.0 μm or greater. The dummy structure 230 can be implemented in a variety of configurations, as appropriate (e.g. as appropriate to account for properties of a plating solution being implemented, such as different rates of deposition of the plating solution flowing on the conductive lands 210 or on the conductive traces 220).

FIG. 3B illustrates a cross-sectional view of the wiring structure 200 shown in FIG. 3A in accordance with some embodiments of the present disclosure. FIG. 3B shows that after plating, the thickness T1 of the conductive land 210 is about 4 μm and the thickness T2 of the conductive trace 220 is substantially the same as that of T1. Thus, the plating uniformity is shown to be improved and controlled.

Figure 4:
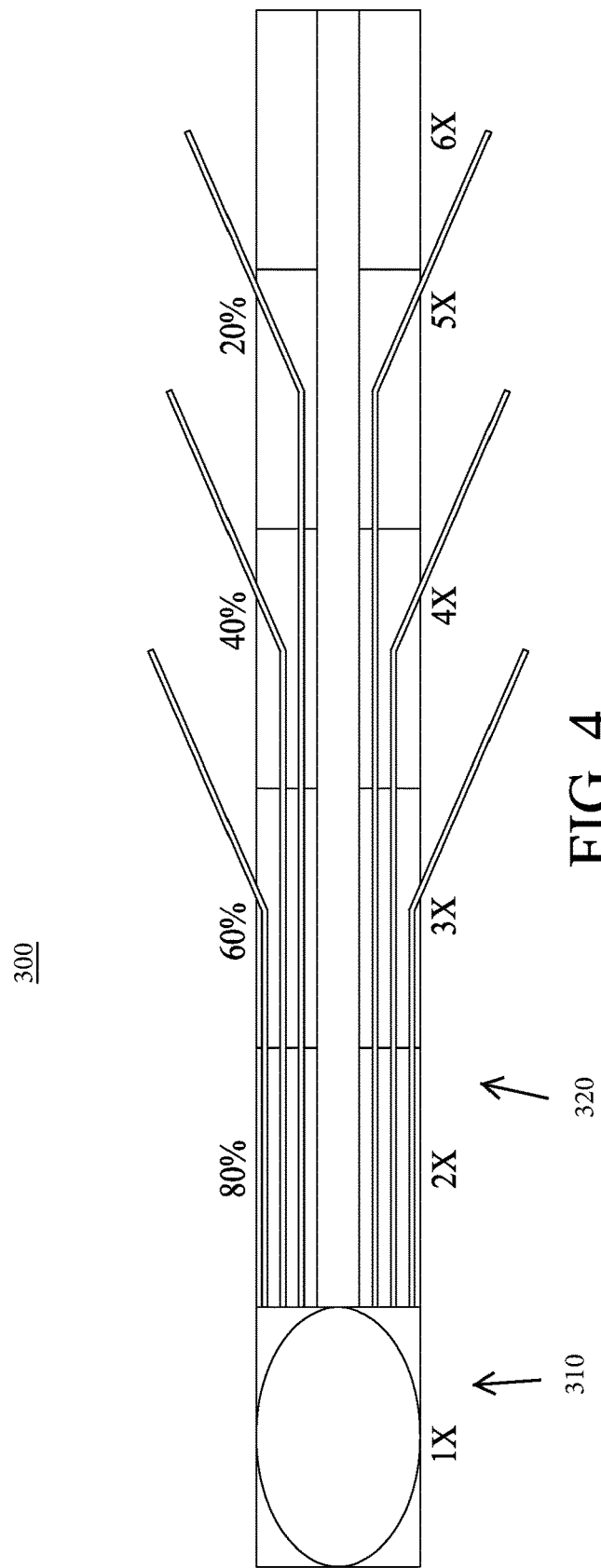
FIG. 4 illustrates some embodiments of a top view of a wiring structure including a dummy structure in accordance with a second aspect of the present disclosure.

FIG. 4 illustrates a top view of some embodiments of a wiring structure 300 including a dummy structure in accordance with a second aspect of the present disclosure. The wiring structure 300 includes six segments 1X-6X. 1X includes a conductive land 310. A conductive trace 320 includes five segments 2X-6X. In some embodiments, each segment includes a dummy structure and may have a respective metal ratio. In some embodiments, a dummy pattern that includes one or more dummy structures is disposed adjacent to at least one of the segments 2X-6X (e.g. a dummy pattern that includes five dummy segments each including at least one dummy structure is disposed such that each segment of the segments 2X-6X has at least one respective dummy segment disposed adjacent. The metal ratio is a ratio of an amount of metal (e.g. measured by volume or by mass) contained in a segment to an amount metal contained in the conductive land 310. As shown in FIG. 4, for example, the second segment 2X is connected to the first segment 1x, and has a metal ratio of about 80%. The third segment 3X, connected to the second segment 2X, has a metal ratio of about 60%; the fourth segment 4X, connected to the third segment 3X, has a metal ratio of about 40%, and the fifth segment 5X, connected to the fourth segment 4X, has a metal ratio of about 20%. The sixth segment 6X, connected to the fifth segment 5X, has a metal ratio less than about 20%. FIG. 4 shows some embodiments in which the metal ratio of each of the plurality of segments is progressively decreased (e.g. monotonically decreases) in a direction away from the conductive land.

In some embodiments, a dummy structure is added to each of the plurality of segments such that the metal ratio of each segment is about 100%, which can help to ensure that after a plating process, there is substantially no thickness gap between the conductive land 310 and the plurality of segments 2X-6X, and the wiring structure 300 is uniformly even. In some embodiments, a metal ratio of 80% is implemented, which can provide for a good balance between uniform plating and lower manufacturing cost or time.

Figure 5B:
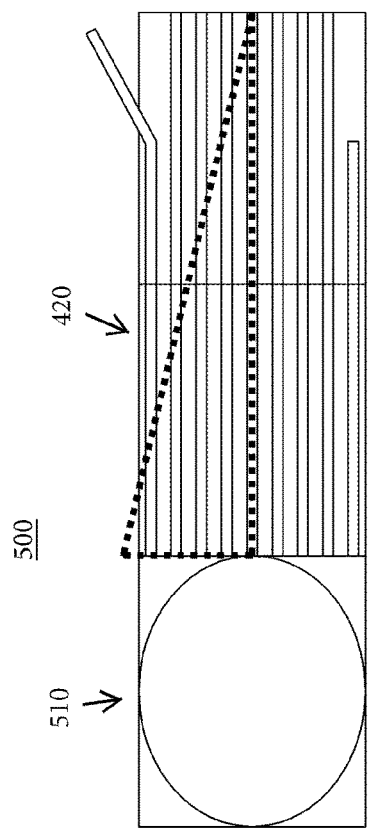
FIG. 5B illustrates a top view of some embodiments of a wiring structure in accordance with a third aspect of the present disclosure.
Figure 5A:
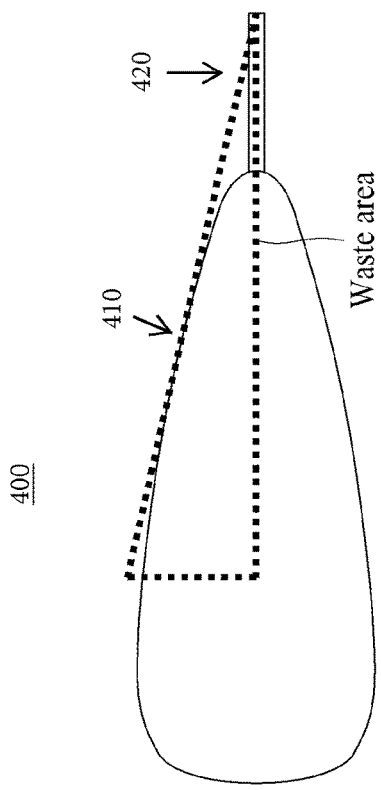
FIG. 5A shows a top view of a wiring structure in accordance with some comparative designs of a wiring structure.

FIG. 5A shows a top view of a wiring structure 400 in accordance with some comparative designs of a wiring structure. As shown in FIG. 5A, a conductive land 410 is a water droplet shape, which can help to improve plating uniformity and reduce stress at a junction of the conductive land 410 and a conductive trace 420. However, the design shown in FIG. 5A occupies excess space for the conductive land 410, as shown by a triangle dotted line in FIG. 5A. On the other hand, FIG. 5B illustrates a top view of some embodiments of a wiring structure 500 in accordance with a fourth aspect of the present disclosure. As shown in FIG. 5B, a conductive land 510 in a round shape saves space, which may accommodate a dummy structure or other wiring layout, as shown by a triangle dotted line in FIG. 5B. Accordingly, another advantage of the wiring design of some embodiments of the present disclosure is that the design can provide for saving space for a conductive land and the space may be used for other wiring design components.

Figure 6:
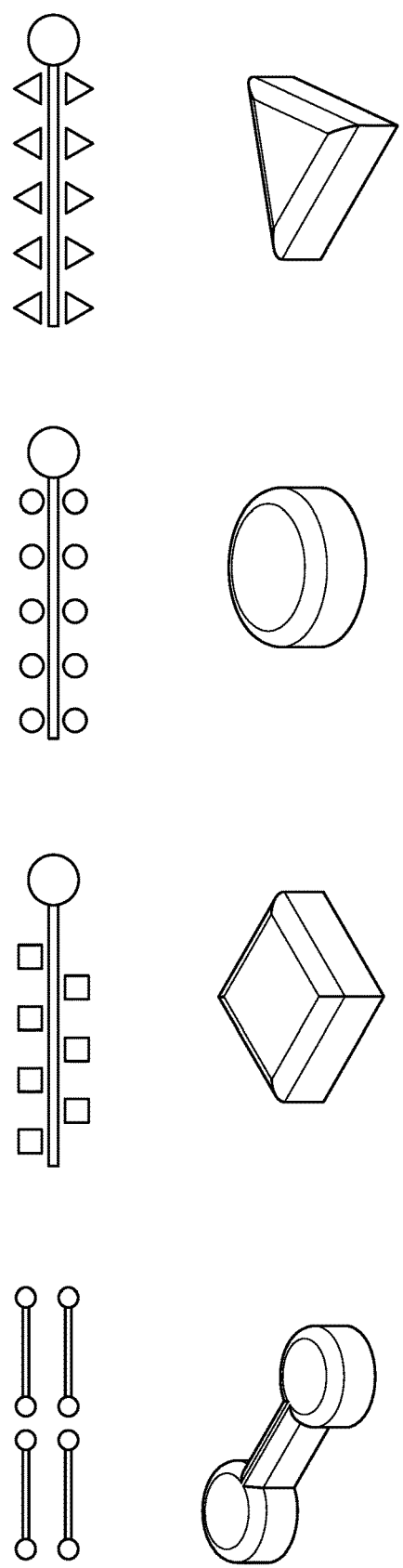
FIG. 6 illustrates various shapes of a dummy structure in accordance with some embodiments of the present disclosure.

FIG. 6 illustrates various shapes of a dummy structure in accordance with some embodiments of the present disclosure. As shown in FIG. 6, the shape of the dummy structure can be any combination of polygonal, round, or geometrical shape, or any other appropriate shape.

Figure 7:
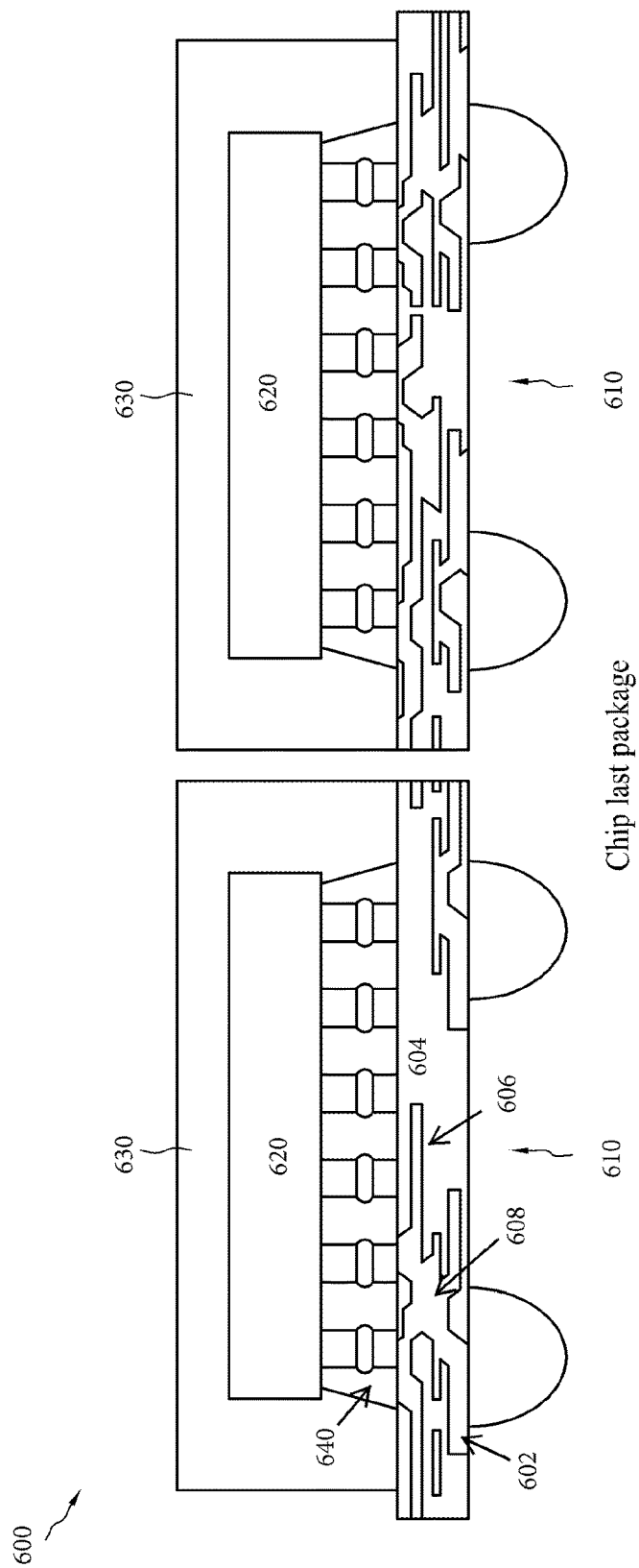
FIG. 7 illustrates some embodiments of a chip-last semiconductor package in accordance with a fourth aspect of the present disclosure.

Embodiments presented herein can be widely used in the field of semiconductor packages. FIG. 7 illustrates some embodiments of a semiconductor package 600 with a chip-last structure in accordance with a fifth aspect of the present disclosure. As shown in FIG. 7, a wiring structure 610 is provided. At least one chip 620 is mounted on the wiring structure 610 (e.g. via flip-chip bonding). An encapsulant layer 630 encapsulates the at least one chip 620. The wiring structure 610 includes a first wiring pattern 602 (e.g. a wiring pattern in accordance with at least one of the embodiments described herein), a dielectric or passivation layer 604 disposed on the first wiring pattern 602, a second wiring pattern 606 (e.g. a wiring pattern in accordance with at least one of the embodiments described herein) disposed on the dielectric or passivation layer 604, and a via 608 that extends through the dielectric or passivation layer 604 and electrically connects the first wiring pattern 602 and the second wiring pattern 606 (e.g. electrically connects a conductive land of the first wiring pattern 602 to a conductive land of the second wiring pattern 606). An underfill 640 is disposed under the chip 620. The dielectric layer 604 may include, or may be formed from, a cured photosensitive dielectric material or another suitable dielectric material. These structures are included in the semiconductor package 600.

Figure 8:
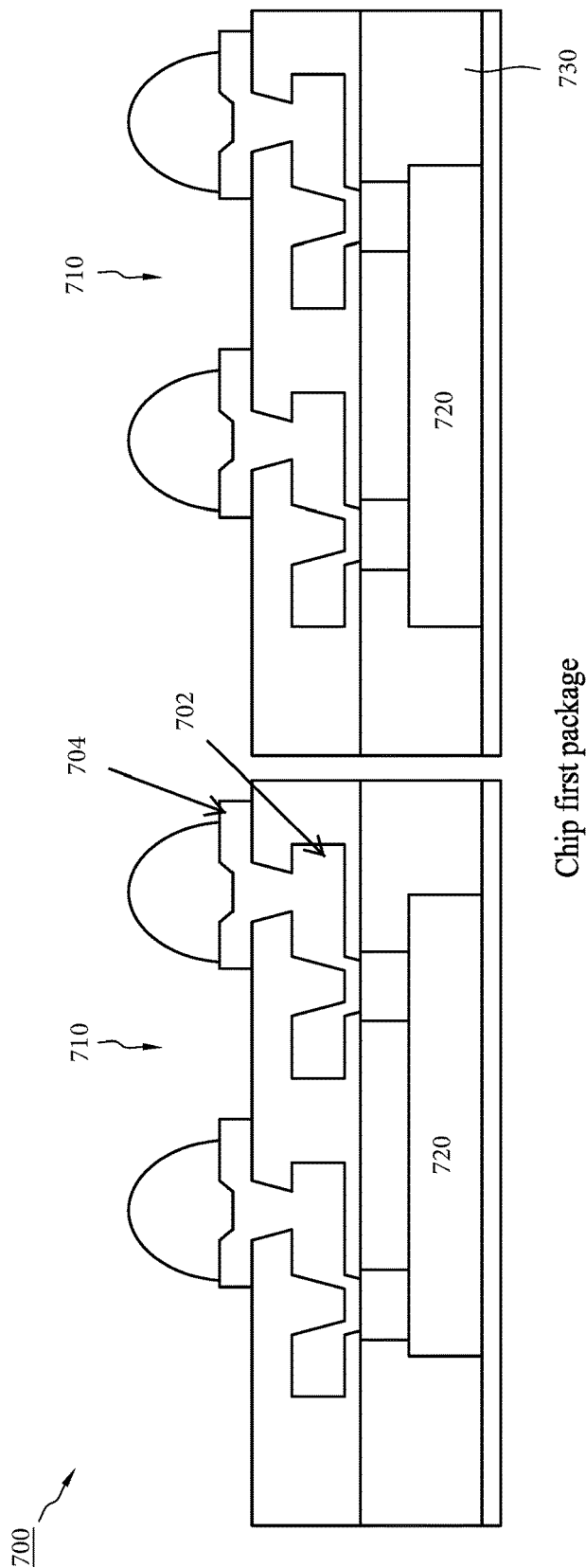
FIG. 8 illustrates some embodiments of a chip-first semiconductor package in accordance with a fifth aspect of the present disclosure.

FIG. 8 also illustrates some embodiments of a semiconductor package 700 with a chip-first structure in accordance with a sixth aspect of the present disclosure. Referring to FIG. 8, at least one chip 720 is provided. An encapsulant layer 730 encapsulates the at least one chip 720. A wiring structure 710 is disposed on the encapsulant layer 730. The wiring structure can include an RDL 702. An under bump metallurgy layer 704 can be disposed on the RDL 702. These structures are included in the semiconductor package 700.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, the term "about" or "substantially" equal in reference to two values can refer to a ratio of the two values being within a range between and inclusive of 0.9 and 1.1.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
a first wiring pattern including a conductive land having a width $W1$ and a surface area A, and a conductive trace having a width $W2$ in a range from 2 micrometers ($\mu m$) to 10 $\mu m$ and electrically connected to the conductive land, wherein $((W1*W2)/A)*100\% \leq$ about 25%;
a dielectric layer covering the first wiring pattern; and
a dummy pattern adjacent to the conductive trace and isolated from the first wiring pattern, wherein the conductive trace comprises a plurality of segments and the conductive land is connected to a first segment of the plurality of segments, the first segment of the plurality of segments of the conductive trace extends from the conductive land, and a ratio of an amount of a conductive material contained in the first segment and the dummy pattern to an amount of the conductive material contained in the conductive land is greater than about 25%.

2. The wiring structure of claim 1, wherein the dummy pattern and the conductive trace is separated by a distance d equal to or greater than about 2 micrometers ($\mu m$).

3. The wiring structure of claim 1, wherein the dummy pattern includes a plurality of portions adjacent to respective ones of the plurality of segments, a ratio of an amount of the conductive material contained in each of the plurality of segments and a respective portion of the dummy pattern to the amount of the conductive material contained in the conductive land is progressively decreased in a direction away from the conductive land.

4. The wiring structure of claim 1, wherein a ratio of a surface area of the first segment and the dummy pattern to the surface area of the conductive land is greater than about 25%.

5. The wiring structure of claim 4, wherein the dummy pattern includes a plurality of portions adjacent to respective ones of the plurality of segments, a ratio of a surface area of each of the plurality of segments and a respective portion of the dummy pattern to the surface area of the conductive land is progressively decreased in a direction away from the conductive land.

6. The wiring structure of claim 1, wherein a length of the first segment is about equal to a maximum width of the conductive land.

7. The wiring structure of claim 1, wherein the conductive trace is a part of a redistribution layer (RDL).

8. The wiring structure of claim 1, further comprising a conductive via extending in the dielectric layer and connected to the conductive land.

9. The wiring structure of claim 1, wherein a thickness $T1$ of the conductive land is greater than a thickness $T2$ of the conductive trace, and $$(T1 - T2) \Big/ \left(2\left(\frac{(T1 + T2)}{2}\right)\right) * 100\% \leq \text{about } 10\%.$$

10. A semiconductor package, comprising:
a wiring structure, comprising:
a first wiring pattern including a conductive land having a width W1 and a surface area A, and a conductive trace having a width W2 in a range from 2 micrometers (μm) to 10 μm and electrically connected to the conductive land, wherein ((W1*W2)/A)*100% ≤ about 25%;
a dielectric layer covering the first wiring pattern; and
a dummy pattern adjacent to the conductive trace and isolated from the first wiring pattern, wherein the conductive trace comprises a plurality of segments and the conductive land is connected to a first segment of the plurality of segments, the first segment of the plurality of segments of the conductive trace extends from the conductive land, and a ratio of an amount of a conductive material contained in the first segment and the dummy pattern to an amount of the conductive material contained in the conductive land is greater than about 25%;
a semiconductor chip electrically connected to the wiring structure; and
an encapsulant covering the semiconductor chip.

11. The semiconductor package of claim 10, wherein the dummy pattern and the conductive trace is separated by a distance d equal to or greater than about 2 μm.

12. The semiconductor package of claim 10, wherein the dummy pattern includes a plurality of portions adjacent to respective ones of the plurality of segments, a ratio of an amount of the conductive material contained in each of the plurality of segments and a respective portion of the dummy pattern to the amount of the conductive material contained in the conductive land is progressively decreased in a direction away from the conductive land.

13. The semiconductor package of claim 10, wherein a ratio of a surface area of the first segment and the dummy pattern to the surface area of the conductive land is greater than about 25%.

14. The semiconductor package of claim 13, wherein the dummy pattern includes a plurality of portions adjacent to respective ones of the plurality of segments, a ratio of a surface area of each of the plurality of segments and a respective portion of the dummy pattern to the surface area of the conductive land is progressively decreased in a direction away from the conductive land.

15. The semiconductor package of claim 10, wherein a length of the first segment is about equal to a maximum width of the conductive land.

16. The semiconductor package of claim 10, further comprising a second wiring pattern disposed on the dielectric layer and electrically connected to the conductive land.

17. The semiconductor package of claim 16, further comprising a conductive via extending in the dielectric layer and connected to the second wiring pattern and the conductive land.

18. The semiconductor package of claim 10, the semiconductor chip is electrically connected to the conductive trace by flip-chip bonding.

19. The semiconductor package of claim 18, further comprising an underfill disposed between the semiconductor chip and the wiring structure.

20. The semiconductor package of claim 10, wherein the conductive trace is a part of a redistribution layer (RDL).

21. The semiconductor package of claim 20, further comprising an under bump metallurgy (UBM) on the RDL.

22. The semiconductor package of claim 10, wherein the dielectric layer includes a cured photosensitive dielectric material.

23. The semiconductor package of claim 10, wherein a thickness T1 of the conductive land is greater than a thickness T2 of the conductive trace, and $$(T1 - T2) \Big/ \left(2\left(\frac{(T1 + T2)}{2}\right)\right) * 100\% \leq \text{about } 10\%.$$

* * * * *